US012713830B2

(12) United States Patent
Joshi et al.

(10) Patent No.: US 12,713,830 B2
(45) Date of Patent: Aug. 18, 2026

(54) SOLID-STATE THERMOELECTRIC HARVESTER UTILIZING TEMPERATURE DIFFERENCE WITHIN A BODY OF WATER

(71) Applicant: Toyota Motor Engineering & Manufacturing North America, Inc., Plano, TX (US)

(72) Inventors: Shailesh N. Joshi, Ann Arbor, MI (US); Yohei Iwahashi, South Lyon, MI (US); Tianzhu Fan, Houston, TX (US); Danny John Lohan, West Bloomfield, MI (US); Jae Seung Lee, Ann Arbor, MI (US)

(73) Assignees: TOYOTA MOTOR ENGINEERING & MANUFACTURING NORTH AMERICA, INC., Plano, TX (US); TOYOTA JIDOSHA KABUSHIKI KAISHA, Toyota (JP)

( * ) Notice: Subject to any disclaimer, the term of this patent is extended or adjusted under 35 U.S.C. 154(b) by 5 days.

(21) Appl. No.: 18/593,664

(22) Filed: Mar. 1, 2024

(65) Prior Publication Data

US 2025/0280732 A1 Sep. 4, 2025

(51) Int. Cl.

*H10N 10/13* (2023.01)
*H02S 10/10* (2014.01)
*H02S 40/44* (2014.01)

(52) U.S. Cl.

CPC ............. *H10N 10/13* (2023.02); *H02S 10/10* (2014.12); *H02S 40/44* (2014.12)

(58) Field of Classification Search

CPC .............................................. H10N 10/00–857

(Continued)

(56) References Cited

U.S. PATENT DOCUMENTS 2,232,961 A * 2/1941 Milnes .................. H10N 10/00 136/211
2023/0140254 A1* 5/2023 Kim ...................... H10N 10/13 136/201
2024/0032426 A1* 1/2024 Goodman ............. H10N 10/13

FOREIGN PATENT DOCUMENTS

CN 201142651 Y 10/2008
CN 103259458 A * 8/2013

(Continued)

OTHER PUBLICATIONS

CN-220173116-U English (Year: 2023).*

(Continued)

*Primary Examiner* — Bach T Dinh
(74) *Attorney, Agent, or Firm* — Jordan IP Law, LLC

(57) ABSTRACT

A generator is provided that includes: a first thermally conductive structure; a second thermally conductive structure; a capillary structure having an inner portion and an outer portion; and a thermoelectric device in thermal contact with the first thermally conductive structure and the second thermally conductive structure. The inner portion draws a first portion of water via a capillary force from a depth below a surface of the body of water and provides it to one of the first thermally conductive structure and the second thermally conductive structure. An atmosphere above the surface of the body of water has a temperature, $T_{D1}$, and water at the depth below the surface has a temperature, $T_{D2}$. The thermoelectric device is configured to generate electricity, based on a difference between $T_{D1}$ and $T_{D2}$, so as to operate an electronic system in the body of water.

16 Claims, 10 Drawing Sheets

(58) Field of Classification Search
USPC .................................................. 136/200–242
See application file for complete search history.

(56) References Cited

FOREIGN PATENT DOCUMENTS

| | | | | | |
|---|---|---|---|---|---|
| CN | 111486068 | A | | 8/2020 | |
| CN | 113038681 | A | * | 6/2021 | ............... H05H 1/24 |
| CN | 111750565 | B | * | 8/2022 | ............. C04B 35/14 |
| CN | 220173116 | U | * | 12/2023 | |
| EP | 3264479 | A1 | * | 1/2018 | ........... F28D 1/0475 |
| JP | 2011177019 | A | * | 9/2011 | |
| JP | 2013087302 | A | | 5/2013 | |
| KR | 101771148 | B | | 8/2017 | |
| UA | 143177 | U | | 7/2020 | |

OTHER PUBLICATIONS

CN-113038681-A English (Year: 2021).*
CN-103259458-A English (Year: 2013).*
CN-111750565-B English (Year: 2022).*
Liping Liu, "Large-scale Ocean-based or Geothermal Power Plants by Thermoelectric Effects", May 8, 2012, 16 pages.
Mathis et al., "Energy self-sufficient systems for monitoring sewer networks", Apr. 7, 2022, 8 pages.
Khorramdarreh et al., "A novel floating piezoelectric energy harvesting from water waves: fully-coupled simulation", Jun. 20, 2023, 24 pages.

* cited by examiner

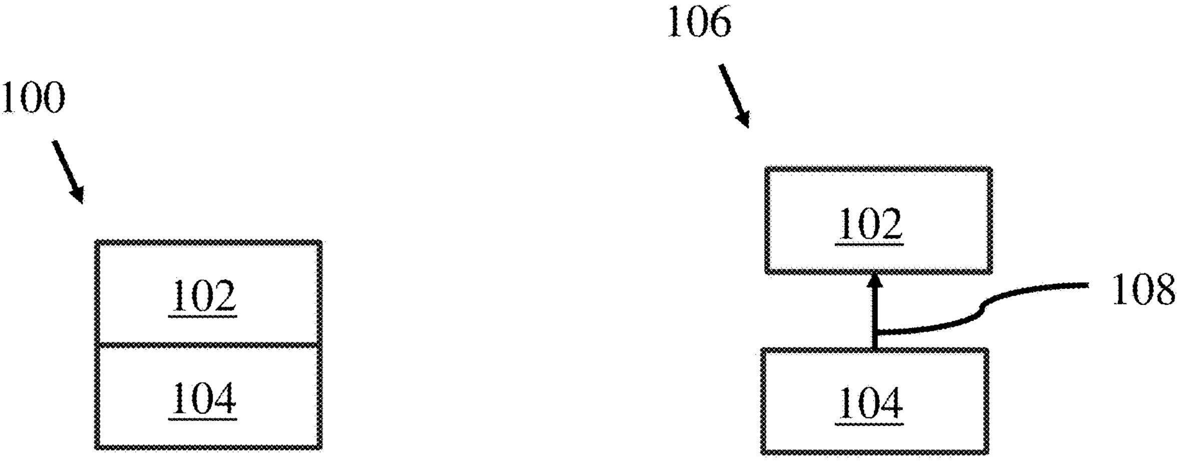
FIG. 1A
FIG. 1B
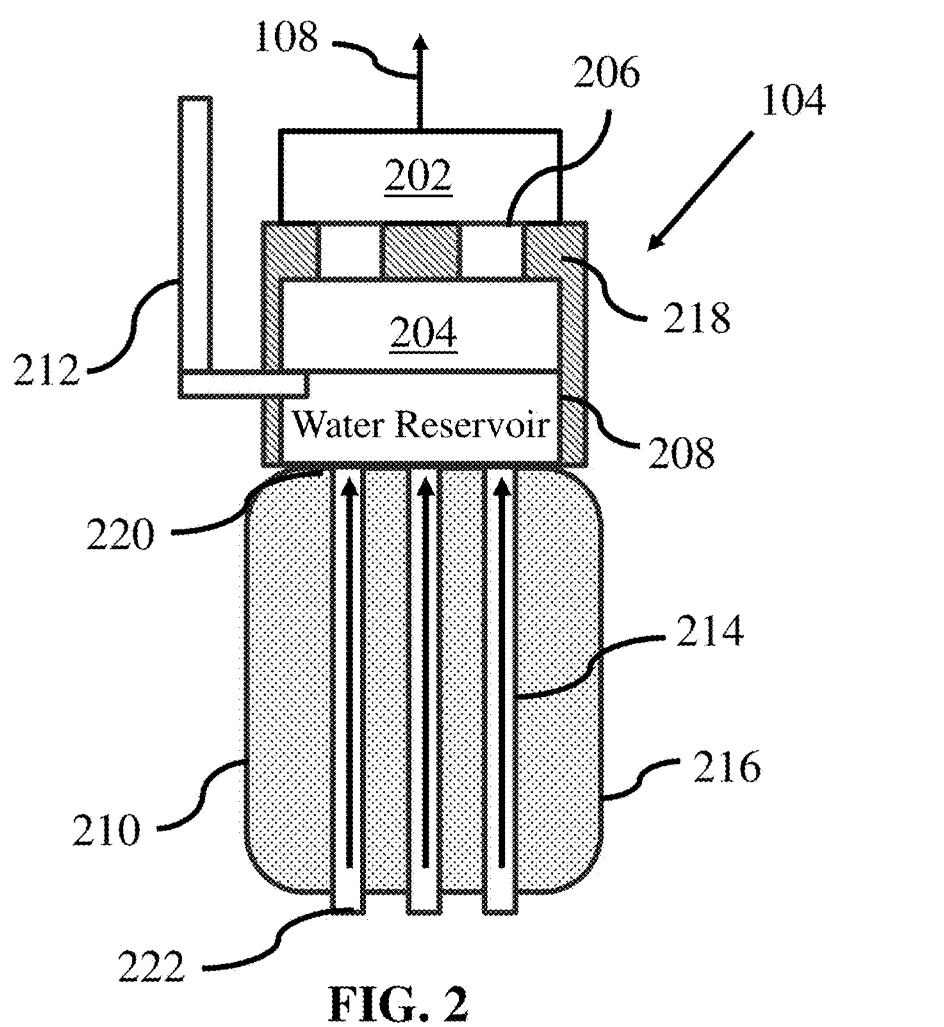
FIG. 2

Daytime Mode

Night Mode

SOLID-STATE THERMOELECTRIC HARVESTER UTILIZING TEMPERATURE DIFFERENCE WITHIN A BODY OF WATER

TECHNICAL FIELD

One or more embodiments relate generally to thermoelectric energy generator/harvesters (TEGs) and systems that use TEGs for passive power.

BACKGROUND

Ocean thermal energy conversion (OTEC) is a technology that converts thermal energy into electricity. An OTEC system is comprised of components such as an evaporator, condenser, turbine, generator, and pump. This system utilizes the temperature difference between warm surface seawater and deep seawater (taken from depths of 600 to 1000 meters) to generate electricity. This is done using a working fluid with a low boiling point that vaporizes as the result of heat transfer from the warm surface seawater in the evaporator. The vapor drives the turbine, which in turn drives a generator to produce electricity. The vapor then is passed through the condenser, where the transfer of heat energy to the cold seawater returns the vapor to a liquid state.

An issue with OTEC systems is that they are quite large and are therefore only appropriate for large-scale power production. Further, buoys and other floating platforms are presently installed in the ocean and in other water bodies, integrating a wide variety of equipment and sensors, allowing for a continuous monitoring over great areas both nearshore and in deep waters. All this equipment provides important information for mariners, fishermen, weather forecasters, ocean and costal engineers, and marine scientists to conduct a variety of maritime activities. The buoys platform can be utilized to sense several ocean parameters such as, atmospheric pressure; wind speed and direction; air temperature; sea-surface and sub-surface temperature; sea-surface and sub-surface salinity; rainfall; wave period and height (and wave spectra); relative humidity; down-welling radiation; currents from buoys; other biogeochemistry elements ($CO_2$, $O_2$, etc.). However, in remote locations, the amount of energy required for their operation is difficult and expensive to obtain.

Buoys are traditionally equipped with sensors and electronic systems, which have their own battery packs that can be charged by solar panels. However, the power that is generated, which is typically inefficiently generated, significantly depends on the conditions of the daylight. Therefore, novel energy generation solutions that can supplement solar panels are required to enhance the operation and applicability of marine systems to develop truly self-powered systems. As such triboelectric nanogenerators (TENG) have been proposed extensively in the literature to harvest energy from ocean waves. Although TENGs provide advantages such as low weight, their long-term reliability poses challenges given the harsh conditions that they encounter in a sea environment in addition to some material compatibility issues.

SUMMARY

An aspect of the present disclosure is drawn to a generator including: a first thermally conductive structure; a second thermally conductive structure; a capillary structure having an inner portion and an outer portion; and a thermoelectric device. The inner portion is configured to draw a first portion of water from a body of water via a capillary force from a depth below a surface of the body of water and to provide the first portion of water from the body of water to one of the first thermally conductive structure and the second thermally conductive structure. An atmosphere above the surface of the body of water has a first temperature, $T_{D1}$, and water of the body of water at the depth below the surface of the body of water has body of water temperature, $T_{D2}$. The thermoelectric device is configured to generate electricity, based on a difference between $T_{D1}$ and $T_{D2}$, so as to operate an electronic system in the body of water.

In some embodiments of this aspect, the generator further includes a thermal insulator configured to insulate at least a portion of the outer portion to reduce heat transfer between the first portion of water from the body of water inside the capillary structure and water of the body of water surrounding the capillary structure.

In some embodiments of this aspect, the first thermally conductive structure is configured to be positioned at or above the surface of the body of water when $T_{D1}>T_{D2}$ so as to attain at least a first thermally conductive structure temperature of $T_{D1}$ via a first heat transfer with the atmosphere or water of the body of water surrounding the first thermally conductive structure, the second thermally conductive structure is configured to be positioned at or above the surface of the body of water when $T_{D2}>T_{D1}$ so as to attain at most a second thermally conductive structure temperature of $T_{D1}$ via a second heat transfer with the atmosphere or water of the body of water surrounding the second thermally conductive structure, and the thermoelectric device is configured to thermally contact the first thermally conductive structure and the second thermally conductive structure.

In some embodiments of this aspect, the generator further includes: a water reservoir configured to receive the first portion of water from the body of water from the capillary structure; and a fluid conduit configured to enable air from above the body of water to enter the water reservoir and to enable a portion of the first portion of water from the body of water to evaporate out from the water reservoir and into air above the body of water.

In some embodiments of this aspect, the generator further includes a second capillary structure having a second inner portion and a second outer portion, wherein the second inner portion may be configured to draw a second portion of water from the body of water via a second capillary force from the depth and to provide the second portion of water from the body of water to the one of the first thermally conductive structure and the second thermally conductive structure.

In some embodiments of this aspect, the generator further includes a photovoltaic cell configured to receive sunlight and generate a second amount of electricity based on the received sunlight.

In some embodiments of this aspect, the generator further includes a solar absorbing material disposed on the first thermally conductive structure, wherein the photovoltaic cell is disposed on the solar absorbing material and is transparent in an infrared spectrum such that infrared light of the received sunlight transmits through the photovoltaic cell and is absorbed by the solar absorbing material so as to heat the solar absorbing material, which heats the first thermally conductive structure via heat transfer.

In some embodiments of this aspect, the generator further includes a radiative cooling material disposed on the second thermally conductive structure and that may be configured to absorb heat from the second thermally conductive structure and emit a portion of the absorbed heat as infrared radiation, thus reducing a temperature of the second thermally conductive structure.

Another aspect of the present disclosure is drawn to a device including: an electronic system requiring electricity to operate in a body of water with an atmosphere having a first temperature, $T_{D1}$, above a surface of the body of water and a body of water depth temperature, $T_{D2}$, at a depth that is below the surface of the body of water; and a generator including a first thermally conductive structure, a second thermally conductive structure, a capillary structure, and a thermoelectric device. The capillary structure has an inner portion and an outer portion, wherein the inner portion may be configured to draw a first portion of water from the body of water via a capillary force from the depth and to provide the first portion of water from the body of water to one of the first thermally conductive structure and the second thermally conductive structure. The thermoelectric device may be configured to generate the electricity, based on a difference between $T_{D1}$ and $T_{D2}$, so as to operate the electronic system.

In some embodiments of this aspect, the generator further includes a thermal insulator configured to insulate at least a portion of the outer portion to reduce heat transfer between water from the body of water inside the capillary structure and water of the body of water surrounding the capillary structure.

In some embodiments of this aspect, the first thermally conductive structure may be configured to be positioned at or above the surface of the body of water when $T_{D1}>T_{D2}$ so as to attain at least a first thermally conductive structure temperature of $T_{D1}$ via a first heat transfer with the atmosphere or water of the body of water surrounding the first thermally conductive structure, the second thermally conductive structure may be configured to be positioned at or above the surface of the body of water when $T_{D2}>T_{D1}$ so as to attain at most a second thermally conductive structure temperature of $T_{D1}$ via a second heat transfer with the atmosphere or water of the body of water surrounding the second thermally conductive structure, and the thermoelectric device may be configured to thermally contact the first thermally conductive structure and the second thermally conductive structure.

In some embodiments of this aspect, the generator further includes: a water reservoir configured to receive the first portion of water from the body of water from the capillary structure; and a fluid conduit configured to enable air from above the body of water to enter the water reservoir and to enable a portion of the first portion of water from the body of water to evaporate out from the water reservoir and into air above the body of water.

In some embodiments of this aspect, the generator further includes a second capillary structure having a second inner portion and a second outer portion, wherein the second inner portion may be configured to draw a second portion of via a second capillary force from the depth and to provide the second portion of water from the body of water to the one of the first thermally conductive structure and the second thermally conductive structure.

In some embodiments of this aspect, the generator further includes a photovoltaic cell configured to receive sunlight and generate a second amount of electricity based on the received sunlight. In some of these embodiments, the generator further includes a solar absorbing material disposed on the first thermally conductive structure, wherein the photovoltaic cell is disposed on the solar absorbing material and is transparent in an infrared spectrum such that infrared light of the received sunlight transmits through the photovoltaic cell and is absorbed by the solar absorbing material so as to heat the solar absorbing material, which heats the first thermally conductive structure via heat transfer. In some of these embodiments, the solar absorbing material includes a material selected from a group of materials including black paint, carbon-based materials, silicon-based materials, metal-organic frameworks, polymers, metal oxides, $SiO_2$, $TiO_2$, $Al_2O_3$, and combinations thereof.

In some embodiments of this aspect, the generator further includes a radiative cooling material disposed on the second thermally conductive structure and may be configured to absorb heat from the second thermally conductive structure and emit a portion of the absorbed heat as infrared radiation, thus reducing a temperature of the second thermally conductive structure. In some of these embodiments, the radiative cooling material includes a material selected from a group of materials including black paint, carbon-based materials, silicon-based materials, metal-organic frameworks, polymers, metal oxides, $SiO_2$, $TiO_2$, $Al_2O_3$, Au, Ag, and combinations thereof.

In some embodiments of this aspect, the electronic system includes at least one of an electronic device selected from a group of electronic devices including a processor, a temperature sensor, a camera, a photodetector, a chemical sensor, a depth finder, a transmitter, a receiver, a clock, a microphone, a speaker, a memory, a display, and combinations thereof.

Another aspect of the present disclosure is drawn to a method including: generating electricity via a generator of a device including an electronic system requiring electricity to operate and the generator, the electronic system being for use in a body of water having an atmosphere with a first temperature, $T_{D1}$, above a surface of the body of water, and a body of water depth temperature, $T_{D2}$, at a depth that is below the surface of the body of water; and operating the electronic system by using the generated electricity, wherein the generator includes a first thermally conductive structure, a second thermally conductive structure, a capillary structure, and a thermoelectric device, wherein the capillary structure has an inner portion and an outer portion, wherein the inner portion may be configured to draw a first portion of water from the body of water via a capillary force from the depth and to provide the first portion of water from the body of water to one of the first thermally conductive structure and the second thermally conductive structure, and wherein the thermoelectric device may be configured to generate the electricity, based on a difference between $T_{D1}$ and $T_{D2}$.

BRIEF SUMMARY OF THE DRAWINGS

The accompanying drawings, which are incorporated in and form a part of the specification, illustrate and explain example embodiments. In the drawings:

FIG. 1A illustrates an example device for use in a body of water in accordance with aspects of the present disclosure;

FIG. 1B illustrates another example device for use in a body of water in accordance with aspects of the present disclosure;

FIG. 2 illustrates a more detailed view of a thermoelectric energy generator/harvester (TEG) of FIG. 1A;

DETAILED DESCRIPTION

Figure 3A:
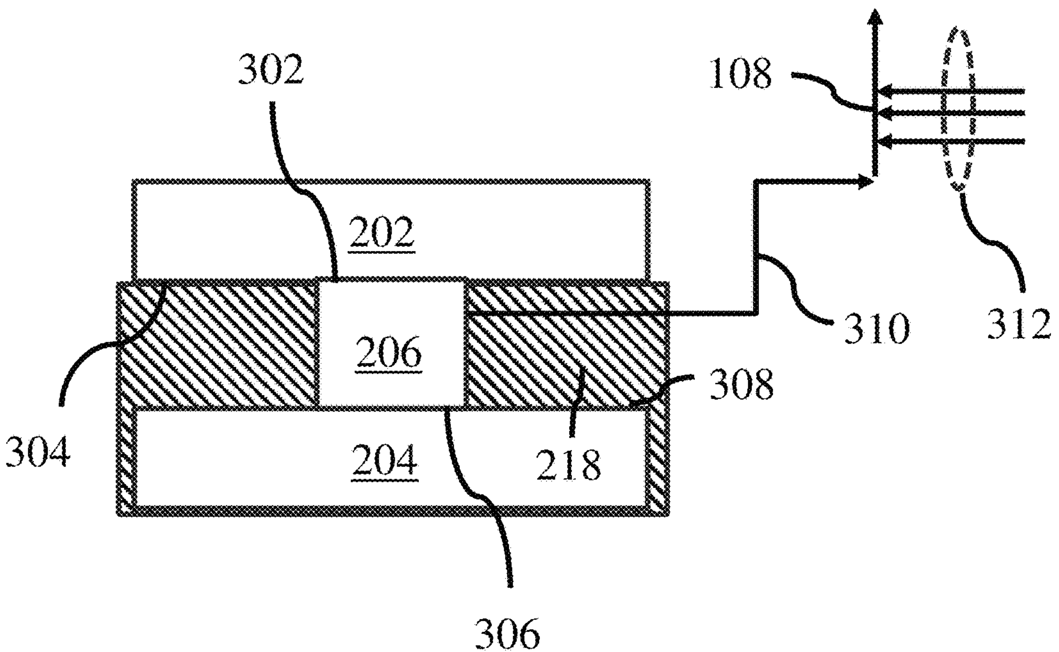
FIG. 3A illustrates a more detailed view of an embodiment of a thermoelectric device in accordance with aspects of the present disclosure.

A system, computer-readable media, and method in accordance with aspects of the present disclosure enable harvesting energy to power oceanic electronic systems that require little power and that do not have large areas to support OTEC systems.

In accordance with aspects of the present disclosure, a thermoelectric energy generator (TEG) can be integrated inside buoys to power sensors as follows. The hot side of the TEG may be exposed to ambient temperature from surface water while the cold side is below the sea surface. The cold side includes a water reservoir where the cold water from sub-ocean surface is drawn by capillary force via capillary tubes.

The length of the capillary tube determines the total pressure drop to draw water from the deep ocean. Based on the pressure difference between the surface and 10 m below, for example, the total capillary pressure (ρ×g×h) is about 100 kPa that can be utilized to move water to the cold side reservoir. Further, a porous coating may be applied on the inner surface of the tube surface to draw water by capillary pressure. By employing ~500 nm particles, capillary pressure of around 100 kPa can be achieved.

The water temperature at a depth of around 10 m is 15° C. For the water to be drawn via capillary force, the reservoir may be exposed to the ambient to bleed air. Also, to prevent heat transfer and convective heat loss to surrounding water the tubes may be insulated via low thermal conductivity material or have a structure like a thermoflask. In some embodiments, the hot side of the TEG may be integrated inside the buoy. Further, in some embodiments, perovskite solar cells may be attached to the surface of the TEG in order to generate additional power and to further increase the hot side temperature of the TEG. The advantage of using perovskite cells is that they are transparent to infrared rays (IR) while generating solar power in the visible spectrum.

Different embodiments may be implemented to increase the hot side temperature. In one embodiment, in case of use in a tropical body of water, where the day temperature is greater than 25° C., an absorber surface can be inserted in between the solar cell and TEG hot side to increase the hot side temperature. In another embodiment, in case of use in a polar body of water, where the water surface temperature (−10° C.) is lower than the sub-sea temperature, radiative cooling can be utilized whereby the cold-side temperature can be made even cooler by utilizing radiative cooling. In some embodiments, metal oxides such as $SiO_2$, $TiO_2$ and $Al_2O_3$ paint may be applied as both solar absorber and radiative cooler.

Example systems and methods of harvesting energy in accordance with aspects of the present disclosure will now be described in greater detail with reference to FIGS. 1A-8.

FIG. 1A illustrates an example device 100 for use in a body of water in accordance with aspects of the present disclosure.

As shown in the figure, device 100 includes an electronic system 102 and a TEG 104. TEG 104 in a broader sense is an example of generator. Electronic system 102 requires electricity to operate. Non-limiting examples of electronic system 102 include an electronic device selected from a group of electronic devices including a processor, a temperature sensor, a camera, a photodetector, a chemical sensor, a depth finder, a transmitter, a receiver, a clock, a microphone, a speaker, a memory, a display, and combinations thereof.

TEG 104 is configured to generate electricity to operate electronic system 102. In some embodiments, TEG 104 generates electricity to directly operate electronic system 102. In some embodiments, electronic system 102 includes a power storage device, such as a battery, capacitor, or the like, wherein TEG 104 generates electricity to be stored in the power storage device. In the figure, electronic system 102 and TEG 104 are illustrated as independent elements. However, in some embodiments, electronic system 102 and TEG 104 may be combined into a unitary device.

In this embodiment, TEG 104 is attached to electronic system 102. However, in some embodiments, TEG 104 may be separated from electronic system 102. This will be described in greater detail with reference to FIG. 1B.

FIG. 1B illustrates another example device 106 for use in a body of water in accordance with aspects of the present disclosure.

As shown in the figure, device 106 includes electronic system 102, TEG 104, and a conducting wire 108. In this embodiment, TEG 104 is separated from electronic system 102 but is configured to provide the generated electricity to electronic system 102 via conducting wire 108.

FIG. 2 illustrates a more detailed view of TEG 104.

As shown in the figure, TEG 104 includes a thermally conductive structure 202, a thermally conductive structure 204, a plurality of thermoelectric devices (a sample of which is labeled as thermoelectric device 206), a water reservoir 208, a water drawing structure 210, and an atmospheric bleed tube 212, and an insulating structure 218. A water drawing structure 210 includes a plurality of capillary structures (a sample of which is indicated as capillary structure 214), and a stabilization structure 216.

Thermally conductive structure 202 is configured to conduct heat from the atmosphere surrounding thermally conductive structure 202 to the plurality of thermoelectric devices. Thermally conductive structure 202 may be made of any known thermally conductive material, non-limiting examples of which include metals, ceramics, graphene, polymers, and combinations thereof. In some embodiments, thermally conductive structure 202 may be coated with a layer of stainless steel, titanium, aluminum, copper and its alloys, high-density polyethylene (HDPE), polyvinyl chloride (PVC), flouropolymers such as PTFE and PVDF, and combinations thereof, to prevent corrosion as TEG 104 is deployed in a body of water.

Thermally conductive structure 204 is configured to conduct heat from water in water reservoir 208 to the plurality of thermoelectric devices. In some embodiments, thermally conductive structure 204 may be made of the same material as thermally conductive structure 202. In some embodiments, thermally conductive structure 204 may be made of a material that is different from that of thermally conductive structure 202. Thermally conductive structure 204 may be made of any known thermally conductive material, non-limiting examples of which include metals, ceramics, graphene, polymers, and combinations thereof. In some embodiments, thermally conductive structure 204 may be coated with a later stainless steel, titanium, aluminum, copper and its alloys, high-density polyethylene (HDPE), polyvinyl chloride (PVC), flouropolymers such as PTFE and PVDF, and combinations thereof, to prevent corrosion as TEG 104 is deployed in a body of water.

Each of the plurality of thermoelectric devices may be any known type of thermoelectric device that is configured to generate electricity based on a temperature difference between thermally conductive structure 202 and thermally conductive structure 204. A thermoelectric includes two dissimilar semiconductors joined together at one end, called the hot junction. The other ends of the semiconductors are connected at a point with a known constant temperature, called the cold junction. A thermoelectric generates electricity based on the Seebeck effect. When the hot junction heats up, the temperature difference between the hot and cold junctions creates a flow of electrons across the junction, resulting in a voltage. This voltage is directly related to the temperature difference between the hot and cold junctions. This will be described in greater detail with reference to FIGS. 3A-B.

FIG. 3A illustrates a more detailed view of an embodiment of thermoelectric device 206.

As shown in the figure, thermoelectric device 206 is configured to contact thermally conductive structure 202 and thermally conductive structure 204. The top and bottom surfaces of thermoelectric device 206 are covered by electrical insulators, which may be made of ceramics. Thermoelectric device 206 is configured to output a generated voltage via an output line 310 that is electrically connected to conducting wire 108. In particular, a surface 302 of thermoelectric device 206 is in contact with a surface 304 of thermally conductive structure 202, whereas a surface 306 of thermoelectric device 206 is in contact with a surface 308 of thermally conductive structure 204.

Thermally conductive structure 202 conducts heat to/from the atmosphere surrounding thermally conductive structure 202. In other words, thermally conductive structure 202 will have a temperature of the atmosphere surrounding thermally conductive structure 202. On the other hand, thermally conductive structure 204 conducts heat to/from the water in water reservoir 208, which is drawn up from deeper below via water drawing structure 210. The water from deeper below will be a different temperature than the water surrounding thermally conductive structure 202. Accordingly, thermally conductive structure 202 will have a temperature of the water from deeper below.

A temperature difference between thermally conductive structure 202 and thermally conductive structure 204 will cause thermoelectric device 206 to output a voltage to output line 310, which is then provided to conducting wire 108. An array of similar output lines 312, each corresponding to a respective one of the plurality of thermoelectric devices, will provide additional voltages to conducting wire 108. The sum of the voltages generated by the plurality of thermoelectric devices will be provided to electronic system 102.

Insulating structure 218 prevents surrounding ambient water from conducting heat to/from thermoelectric device 206, thermally conductive structure 204, and water reservoir 208. Accordingly, thermally conductive structure 204 has the temperature of water in water reservoir 208 as opposed to the temperature of the water surrounding thermally conductive structure 204. Further, thermoelectric device 206 will generate electricity based only on the difference between the temperature of thermally conductive structure 202 and the temperature of thermally conductive structure 204.

In some embodiments, the thermoelectric devices are not in direct contact with thermally conductive structure 202 and thermally conductive structure 204. This will be described in greater detail with reference to FIG. 3B.

Figure 3B:
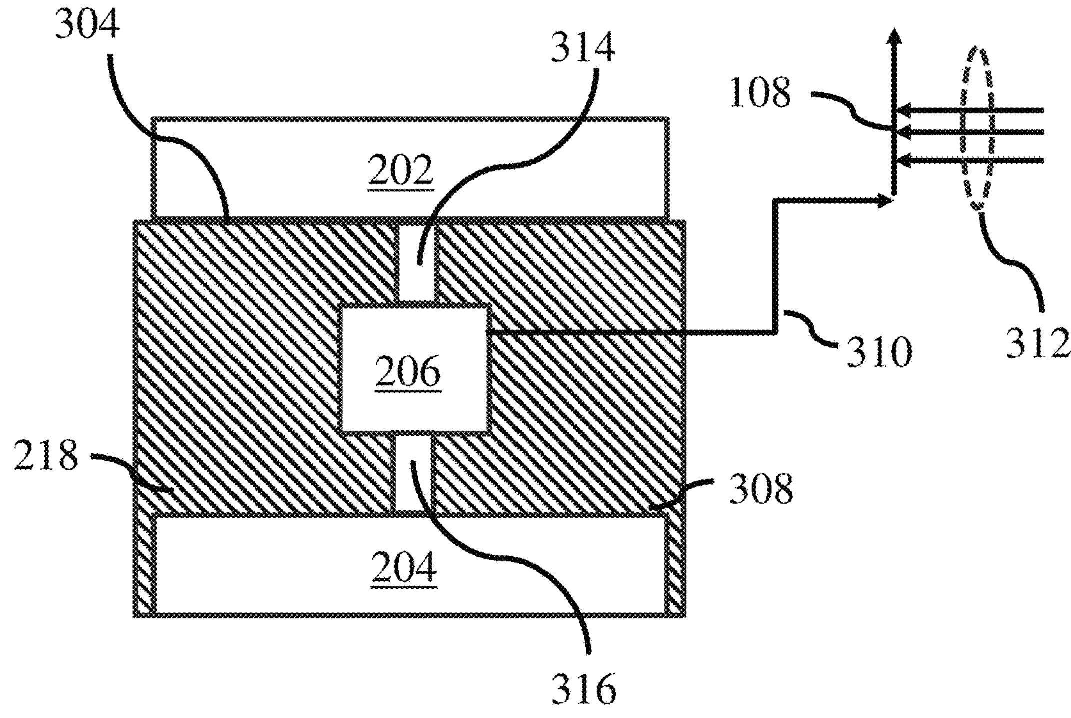
FIG. 3B illustrates a more detailed view of another embodiment of thermoelectric device in accordance with aspects of the present disclosure.

FIG. 3B illustrates a more detailed view of another embodiment of thermoelectric device 206.

As shown in the figure, thermoelectric device 206 is in thermal contact with thermally conductive structure 202 via a thermally conductive structure 314 and is in thermal contact with thermally conductive structure 204 via a thermally conductive structure 316.

Returning to FIG. 2, water reservoir 208 is configured to hold water.

Atmospheric bleed tube 212 is configured to provide ambient air from above a body of water into water reservoir 208 and to enable water to evaporate from water reservoir 208 into the air above the body of water.

Water drawing structure 210 may be any device or system that is configured to draw water from below water reservoir 208 into water reservoir via a capillary force.

In this example embodiment, water drawing structure 210 includes a plurality of capillary structures, a sample of which is labeled as capillary structure 214. Each capillary structure has an inner portion and an outer portion, wherein the inner portion is configured to draw a first portion of water from the body of water via a capillary force from a depth below water reservoir 208 and to provide a portion of water from the body of water to the water reservoir so as to contact thermally conductive structure 204.

Capillary force, also known as capillary action, is a phenomenon that governs the movement of liquids in tight spaces. There are three aspects to capillary force, cohesion, adhesion, and surface tension. Cohesion refers to the attractive forces between molecules of the same type. In water, for example, molecules like to stick together. Adhesion is the attraction between molecules of different types. Water molecules have an affinity to stick to other materials like glass or paper. Surface tension is the tendency of a liquid's surface to act like a thin elastic film. It arises from the cohesive forces pulling inwards at the surface.

When liquid like water is put into a narrow tube, its molecules come into close contact with the tube walls. The adhesive forces between water and the tube become stronger than the cohesive forces within the water itself. This imbalance creates a pulling force that draws the liquid up the tube walls. Think of it like water molecules reaching out and grabbing onto the tube, pulling themselves and their neighbors along for the ride. Surface tension plays a crucial role here, too. It helps maintain the integrity of the water column as it climbs, forming the characteristic curved meniscus seen at the top of a straw. The diameter of the tube plays a critical role in capillary action. The narrower the tube, the stronger the adhesive forces become relative to cohesion. This is why water climbs higher in thinner tubes.

Capillary rise relates the height to which a liquid will rise in a capillary to the surface tension, density of the liquid, gravity, and radius of the capillary. Capillary rise, h, is defined as follows:

$$h=2\ \gamma\ \cos(\theta)/\rho\ g\ r \quad \text{(Equation 1)}$$

Where: h is the capillary rise, γ is the liquid-air surface tension, θ is the contact angle, ρ is the density of the liquid, g is the acceleration due to gravity, and r is the radius of the tube.

Equation 1 shows that the capillary rise is: directly proportional to the surface tension and cosine of the contact angle; and inversely proportional to the density of the liquid and the radius of the capillary. As such, denser liquids and wider capillaries rise less.

In some embodiments, each capillary structure is a tube, having a length from about 1 m to 10 m. In some embodiments, a porous coating may be applied to the inner surface of each capillary structure to affect the contact angle, and thus increase the capillary rise. A non-limiting example of a porous coating includes porous copper made from a copper-based sintered porous or electrochemical method. In some embodiments, a porous material may be inserted into each capillary structure to wick water up each capillary structure. Similarly, a non-limiting example of a porous material includes porous copper made from a copper-based sintered porous or electrochemical method.

Stabilization structure 216 provides two functions: one, stabilization structure 216 stabilizes the plurality of capillary structures; and two, stabilization structure acts as a thermal insulator in that it provides thermal insulation to the plurality of capillary structures. A non-limiting example of a material of stabilization structure 216 includes concrete.

As for stabilization, based on equation 1 discussed above, the length, l, of each capillary structure is orders of magnitude larger than the lateral cross-section, for example in the case of a circular cross-section, the diameter, d, e.g., l>>d. Accordingly, water current, debris, or undersea life may bend or break the capillary structures. Therefore, stabilization structure 216 surrounds, and in some embodiments, encapsulates the plurality of capillary structures provide protection, maintain structural integrity, and maintain relative position of each of the plurality of capillary structures.

As for thermal insulation, as will be described in greater detail below, the water temperature changes as a function of depth between a top portion 220 of water drawing structure 210 and a bottom portion 222 of water drawing structure 210. The purpose of drawing water from bottom portion 222 and into water reservoir 208 is to maintain the water temperature of the water in water reservoir 208 as the same water temperature of the water at bottom portion 222. For this reason, stabilization structure 216 thermally insulates the water in each of the plurality of capillary structures from the water surrounding water drawing structure 210. Accordingly, the water temperature of the water in water reservoir 208 is maintained as the same water temperature of the water at bottom portion 222 as a result of the thermal insulation provided by stabilization structure 216.

In operation, TEG 104 is deployed with an electronic system in a body of water. This will be described in greater detail with reference to FIGS. 4A-9.

Figure 4A:
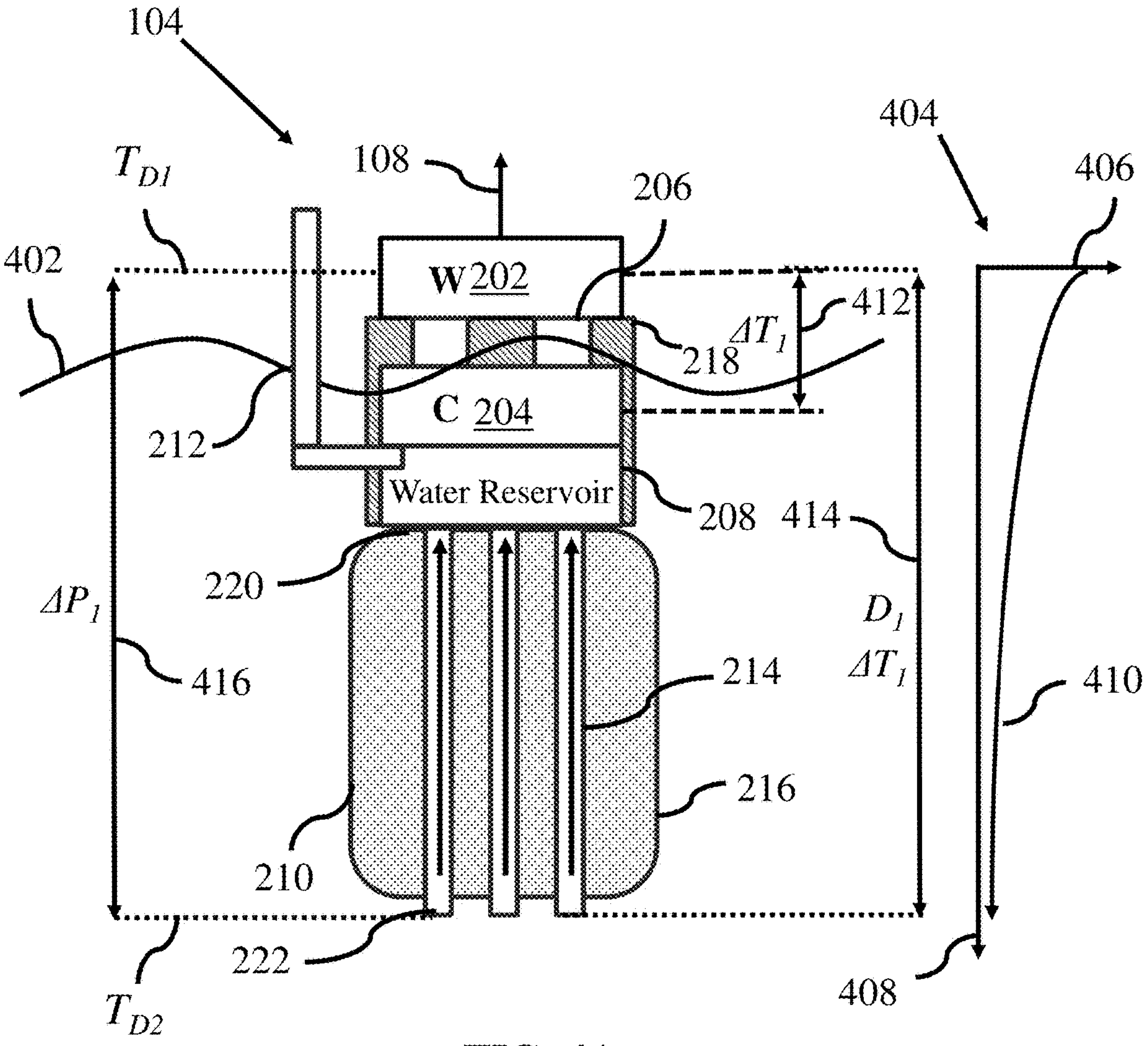
FIG. 4A illustrates the TEG of FIG. 2 implemented in a body of water.

FIG. 4A illustrates TEG 104 implemented in a body of water.

As shown in the figure, TEG 104 is at a surface 402 of a body of water. A graph 404 includes an x-axis 406, a y-axis 408, and a function 410. X-axis 406 corresponds to temperature and is measured in units of degrees C. Y-axis 408 corresponds to the distance from thermally conductive structure 202 to the bottom of water drawing structure 210 and is measured in units of meters. Function 408 illustrates the temperature as a function of the distance from thermally conductive structure 202 to the bottom of water drawing structure 210. As seen from function 408, the temperature of is higher above surface 402 of the body of water and decreases as the distance from conductive structure 202 to the bottom of water drawing structure 210 increases.

In this example, bottom portion 222 of water drawing structure 210 is a distance $D_1$ from the thermally conductive structure 202. There is pressure difference, $\Delta P_1$, of the water at bottom portion 222 at distance $D_1$ as compared to that at surface 402 of the body of water. It is this pressure difference that must be overcome by the capillary pressure of each of the plurality of capillary structures in order for water drawing structure to draw water from bottom portion 222 to water reservoir 208.

Further, the atmosphere above surface 402 of the body of water has a temperature $T_{D1}$, whereas the temperature of the water at bottom portion 222 at distance $D_1$ has a temperature $T_{D2}$. As evidenced by graph 404, in this situation, $T_{D1}>T_{D2}$. Accordingly, there is a temperature difference, $\Delta T_1=T_{D1}-T_{D2}$, of the water at bottom portion 222 at distance $D_1$ as compared to that above surface 402 of the body of water. Accordingly, when the water from bottom portion 222 is drawn up to water reservoir 208, the temperature of the water is transferred to thermally conductive structure 204.

In this case, the water from bottom portion 222 has a lower temperature than the atmosphere above surface 402 of the body of water, as evidenced by function 410. Therefore, in this case, thermally conductive structure 204 has a lower temperature than thermally conductive structure 202. As such, in this case, thermally conductive structure 204 is a cold side, whereas thermally conductive structure 202 is a warm side. The temperature difference, $\Delta T_1$, causes each of the plurality of thermoelectric devices, such as thermoelectric device 206, to generate electricity, which is provided to electronic system 102 (not shown) via conducting wire 108.

In an example embodiment, $D_1$, is approximately 10 meters, wherein a corresponding temperature difference, $\Delta T_1$, is approximately 10-12° C.

There are some situations wherein the temperature of the atmosphere above the surface of the body water of is colder than water below the surface of the body of water. For example, in polar regions, such as at the Artic and Antarctic regions, the extreme cold atmosphere above the body of water cools the surface of the body of water. However, below the surface of the body of water, the water may warm to a certain depth before it again starts to cool. In such situations, the warm side and the cold side of a TEG in accordance with aspects of the present disclosure are flipped from that as discussed above with reference to FIG. 4A. This will be described in greater detail with reference to FIG. 4B.

Figure 4B:
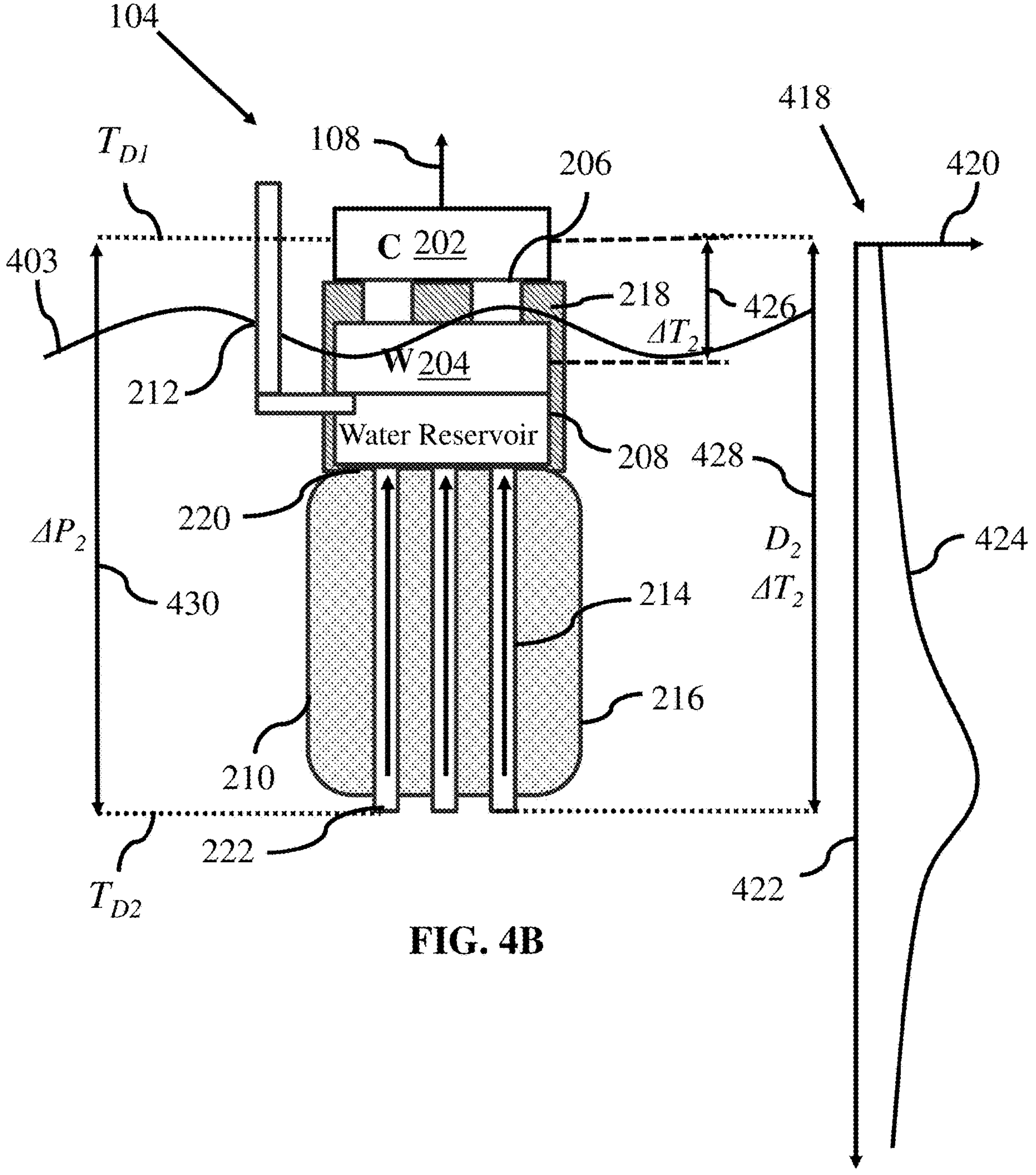
FIG. 4B illustrates the TEG of FIG. 2 implemented in an artic/Antarctic body of water.

FIG. 4B illustrates TEG 104 implemented in a polar body of water.

As shown in the figure, TEG 104 is at the surface of a body of water 403. A graph 418 includes an x-axis 420, a y-axis 422, and a function 424. X-axis 420 corresponds to temperature and is measured in units of degrees C. Y-axis 422 corresponds to the distance from thermally conductive structure 202 to the bottom of water drawing structure 210 and is measured in units of meters. Function 424 illustrates the temperature as a function of the distance from thermally conductive structure 202 to the bottom of water drawing structure 210. As seen from function 424, the water temperature of the atmosphere above surface 402 of the body water is low, increases to a maximum temperature at a distance, $D_2$, and then decreases as the distance further increases.

In this example, bottom portion 222 of water drawing structure 210 is a distance $D_2$ from the thermally conductive structure 202. There is pressure difference, $\Delta P_2$, of the water at bottom portion 222 at depth $D_2$ as compared to that at surface 402 of the body of water. It is this pressure difference that must be overcome by the capillary pressure of each of the plurality of capillary structures in order for water drawing structure to draw water from bottom portion 222 to water reservoir 208.

Further, the atmosphere above surface 403 of the body of water has a temperature $T_{D1}$, whereas the temperature of the water at bottom portion 222 at distance $D_1$ has a temperature $T_{D2}$. As evidenced by graph 418, in this situation, $T_{D1}<T_{D2}$. Accordingly, there is a temperature difference, $\Delta T_2$, of the water at bottom portion 222 at depth $D_2$ as compared to that of the atmosphere above surface 403 of the body of water. Accordingly, when the water from bottom portion 222 is drawn up to water reservoir 208, the temperature of the water is transferred to thermally conductive structure 204.

In this case, the water from bottom portion 222 has a higher temperature than the atmosphere above surface 403 of the body of water, as evidenced by function 424. Therefore, in this case, thermally conductive structure 204 has a higher temperature than thermally conductive structure 202. As such, in this case, thermally conductive structure 204 is a warm side, whereas thermally conductive structure 202 is a cold side. The temperature difference, $\Delta T_2$, causes each of the plurality of thermoelectric devices, such as thermoelectric device 206, to generate electricity, which is provided to electronic system 102 (not shown) via conducting wire 108.

When the warm side of a TEG in accordance with aspects of the present disclosure is below the cold side, for example as discussed above with reference to FIG. 4B, the cold side may be further cooled via radiative cooling. This will be described in further detail with reference to FIG. 5.

Figure 5:
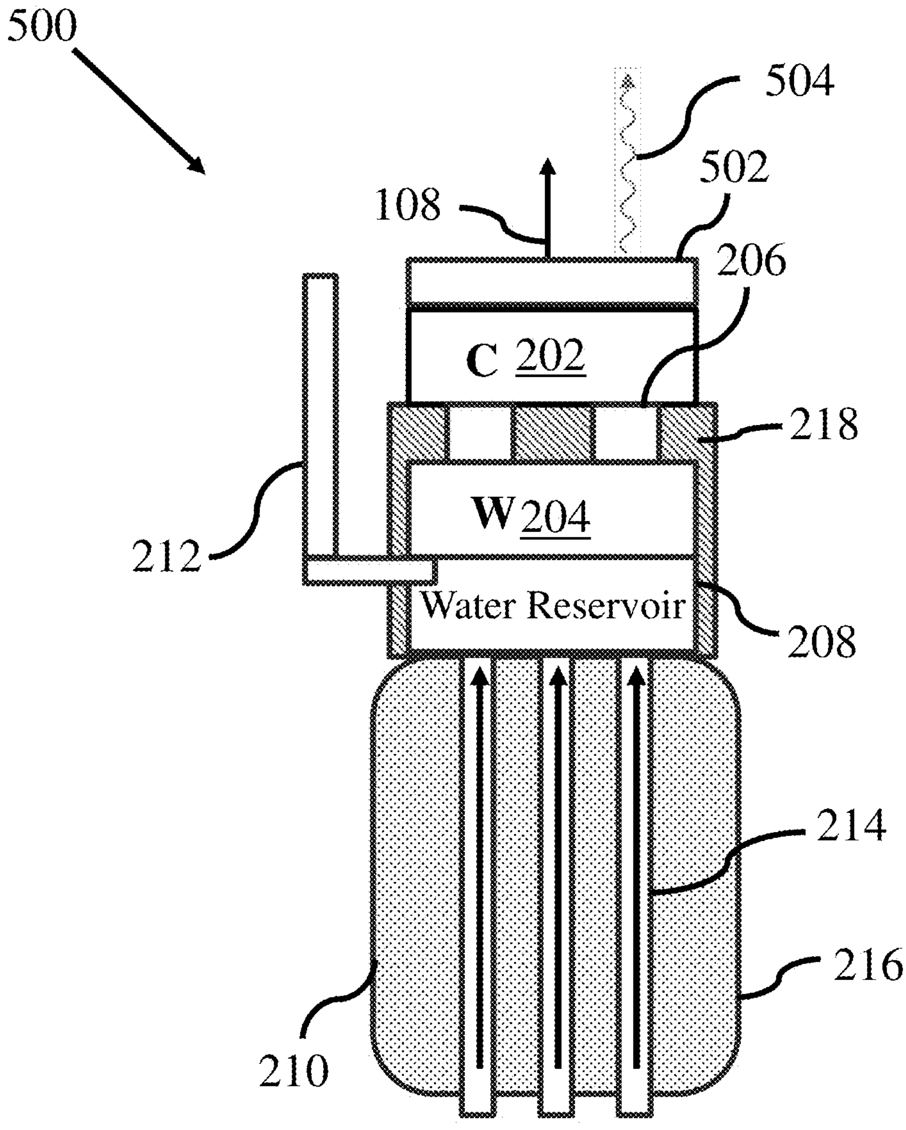
FIG. 5 illustrates another example TEG in accordance with aspects of the present disclosure.

FIG. 5 illustrates another example TEG 500 in accordance with aspects of the present disclosure.

As shown in the figure, TEG 500 differs from TEG 104 in that TEG 500 includes a radiative cooling layer 502 disposed on thermally conductive structure 202.

Radiative cooling layer 502 may be made of any known radiative cooling material, non-limiting examples of which include black paint, carbon-based materials, silicon-based materials, metal-organic frameworks, polymers, metal oxides such as $SiO_2$, $TiO_2$, $Al_2O_3$, Au, Ag, and combinations thereof.

Radiative cooling layer 502 efficiently emit thermal radiation 504 in the "atmospheric window" (8-13 μm), a wavelength range where the atmosphere is relatively transparent. This allows radiative cooling layer 502 to lose heat to space without significant reabsorption by the atmosphere, leading to a cooling effect. This cooling effect is transferred to thermally conductive structure 202, thus further reducing the temperature of thermally conductive structure 202. As such, the temperature difference between thermally conductive structure 202 and thermally conductive structure 204, for example when deployed wherein thermally conductive structure 202 is the cold side and thermally conductive structure 204 is the warm side, is further increased. This increase in temperature difference between thermally conductive structure 202 and thermally conductive structure 204 translates into higher power output generated by the plurality of thermoelectric devices.

When the cold side of a TEG in accordance with aspects of the present disclosure is below the warm side, for example as discussed above with reference to FIG. 4A, additional electricity may be generated and the warm side may be further heated a photovoltaic cell. This will be described in further detail with reference to FIG. 6.

Figure 6:
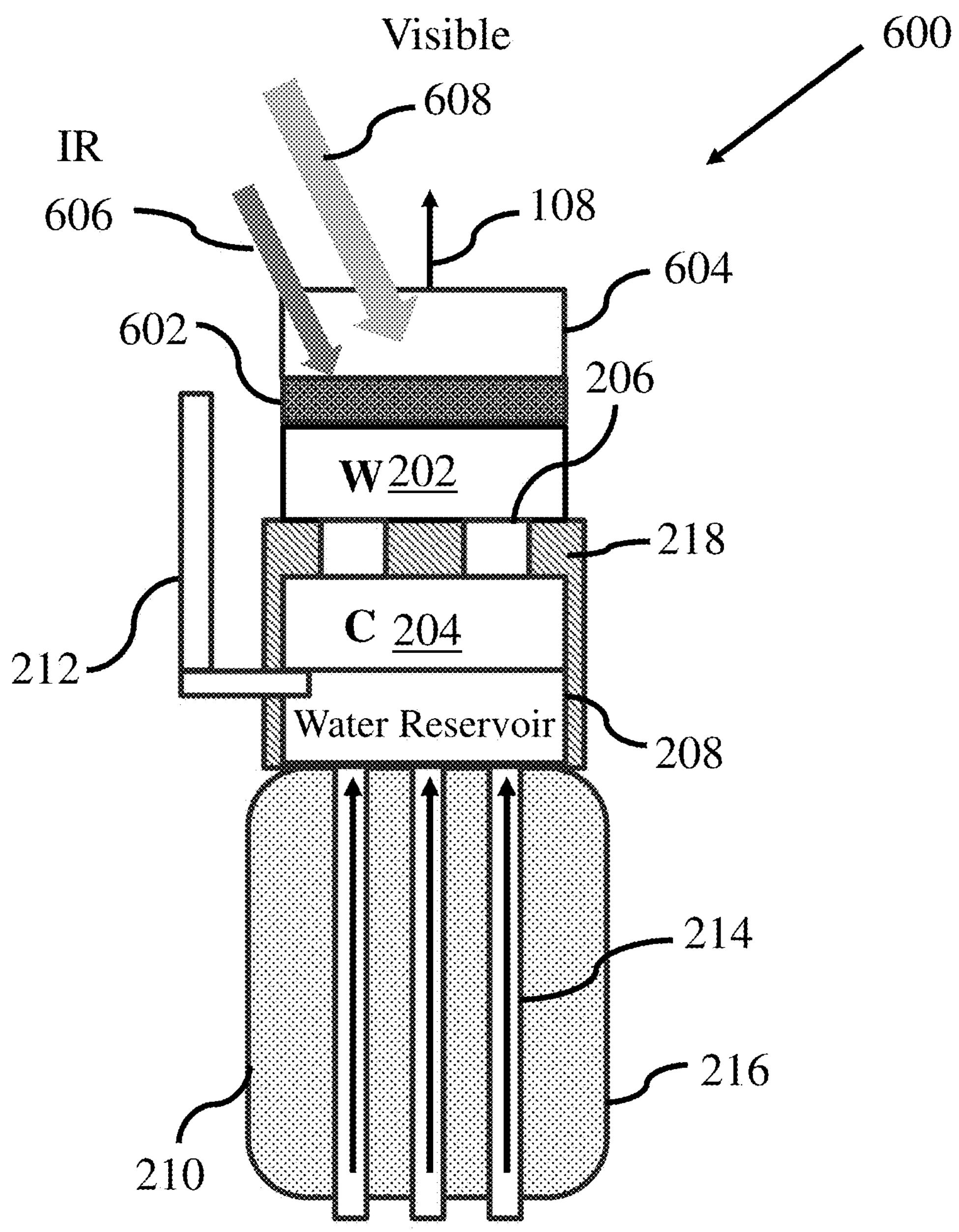
FIG. 6 illustrates another example TEG in accordance with aspects of the present disclosure.

FIG. 6 illustrates another example TEG 600 in accordance with aspects of the present disclosure.

As shown in the figure, TEG 600 differs from TEG 104 in that TEG 600 includes a solar absorbing layer 602 disposed on thermally conductive structure 202, and a near infra-red (NIR) transparent solar cell 604 disposed on solar absorbing layer 602.

Solar absorbing layer 602 may be made of any known solar absorbing material, non-limiting examples of which include black paint, carbon-based materials such as carbon nano tubes (CNT), graphene, and combinations thereof.

NIR transparent solar cell 604 may be any known solar cell that is configured to be transparent in at least one of the Infra-red (IR) spectrum and the NIR spectrum and generate electricity upon incidence of light in spectrums outside the NIR spectrum.

In operation, sunlight is incident upon NIR transparent solar cell 604. Infra-red (IR) and NIR light 606 passes through NIR transparent solar cell 604 and is incident upon solar absorbing layer 602. As such, the IR and NIR light 606 is absorbed by solar absorbing layer 602, which heats solar absorbing layer 602. This increased heat is transferred to thermally conductive structure 202, thus further increasing the temperature of thermally conductive structure 202. As such, the temperature difference between thermally conductive structure 202 and thermally conductive structure 204, for example when deployed wherein thermally conductive structure 202 is the warm side and thermally conductive structure 204 is the cold side, is further increased. This increase in temperature difference between thermally conductive structure 202 and thermally conductive structure 204 translates into higher power output generated by the plurality of thermoelectric devices.

Still further, NIR transparent solar cell 604 converts ultra-violet (UV) to visible light 608 of the incident sunlight into additional electricity, which is additionally provided to electronic system 102 (not shown) via conducting wire 108.

In some cases, the cold side of a TEG in accordance with aspects of the present disclosure is below the warm side, for example as discussed above with reference to FIG. 4A, during the daytime, whereas the warm side of the TEG is below the cold side, for example as discussed above with reference to FIG. 4*b*, during the nighttime. In these cases, additional electricity may be generated using a material that functions as a solar absorbing material during the day and functions as a radiative cooling material during the night. This will be described in further detail with reference to FIGS. 7A-B.

Figure 7A:
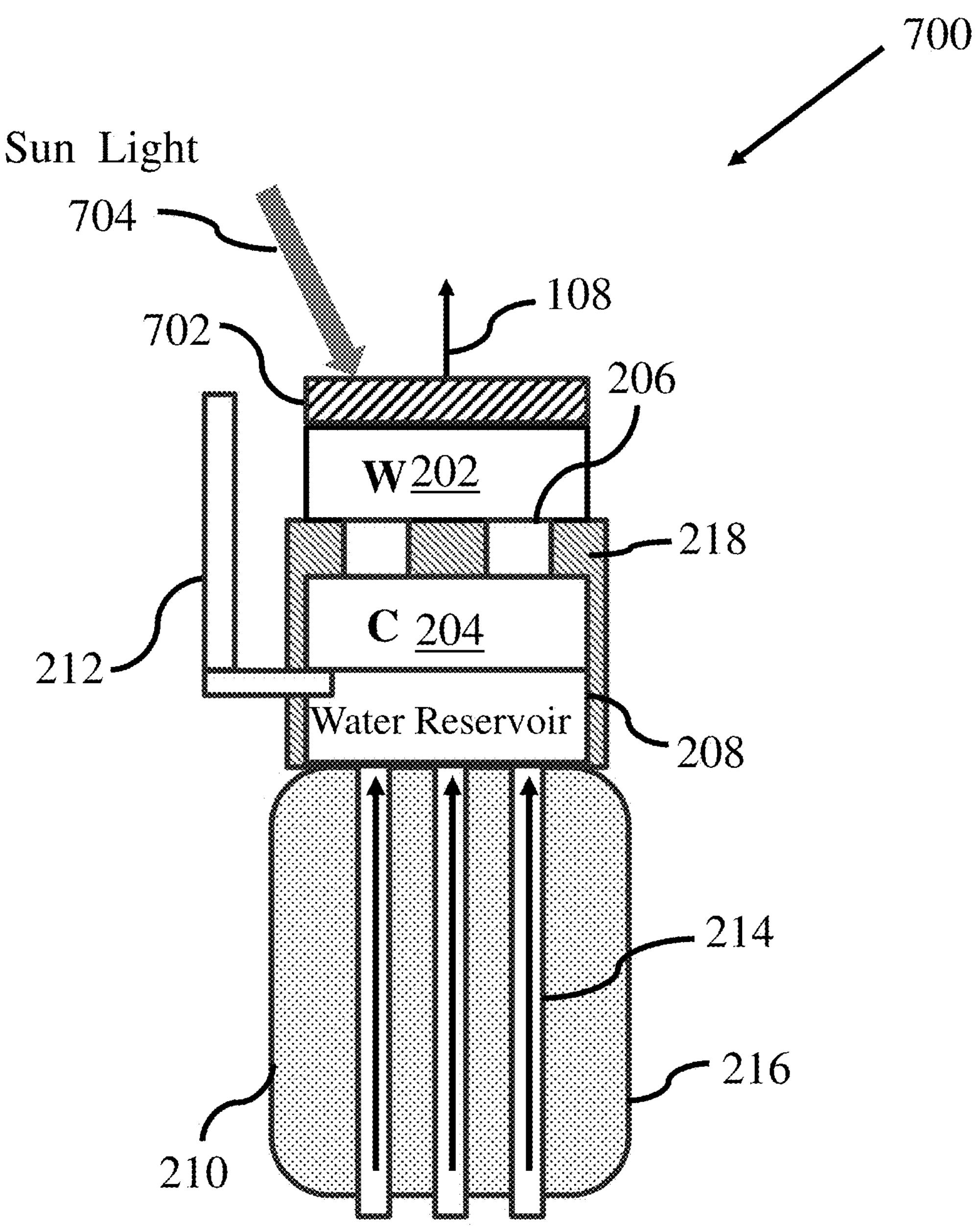
FIG. 7A illustrates another example TEG in accordance with aspects of the present disclosure operating in a daytime mode.

FIG. 7A illustrates another example TEG 700 in accordance with aspects of the present disclosure operating in a daytime mode.

As shown in the figure, TEG 700 differs from TEG 104 in that TEG 700 includes a hybrid solar absorbing and radiative cooling layer 702 disposed on thermally conductive structure 202.

Hybrid solar absorbing and radiative cooling layer 702 may be made of any known hybrid solar absorbing and radiative cooling material, non-limiting examples of which include black painted ceramic material, such as $TiO_2$ and $Al_2O_3$, and carbon-based materials, and combinations thereof.

During the daytime, the sun heats the surface of the body of water, such that TEG 700 will be configured wherein thermally conductive structure 202 is the warm side and thermally conductive structure 204 is the cold side, for example as discussed above with reference to FIG. 4A. In operation in the daytime mode, sunlight 704 is incident upon hybrid solar absorbing and radiative cooling layer 702. As such, the sunlight 704 is absorbed by hybrid solar absorbing and radiative cooling layer 702, which heats hybrid solar absorbing and radiative cooling layer 702. This increased heat is transferred to thermally conductive structure 202, thus further increasing the temperature of thermally conductive structure 202. As such, the temperature difference between thermally conductive structure 202 and thermally conductive structure 204, for example when deployed wherein thermally conductive structure 202 is the warm side and thermally conductive structure 204 is the cold side, is further increased. This increase in temperature difference between thermally conductive structure 202 and thermally conductive structure 204 translates into higher power output generated by the plurality of thermoelectric devices.

During the nighttime, the sun no longer heats the surface of the body of water. In these situations, TEG 700 will be configured wherein thermally conductive structure 202 is the cold side and thermally conductive structure 204 is the warm side, for example as discussed above with reference to FIG. 4B. This will be described in greater detail with reference to FIG. 7B.

Figure 7B:
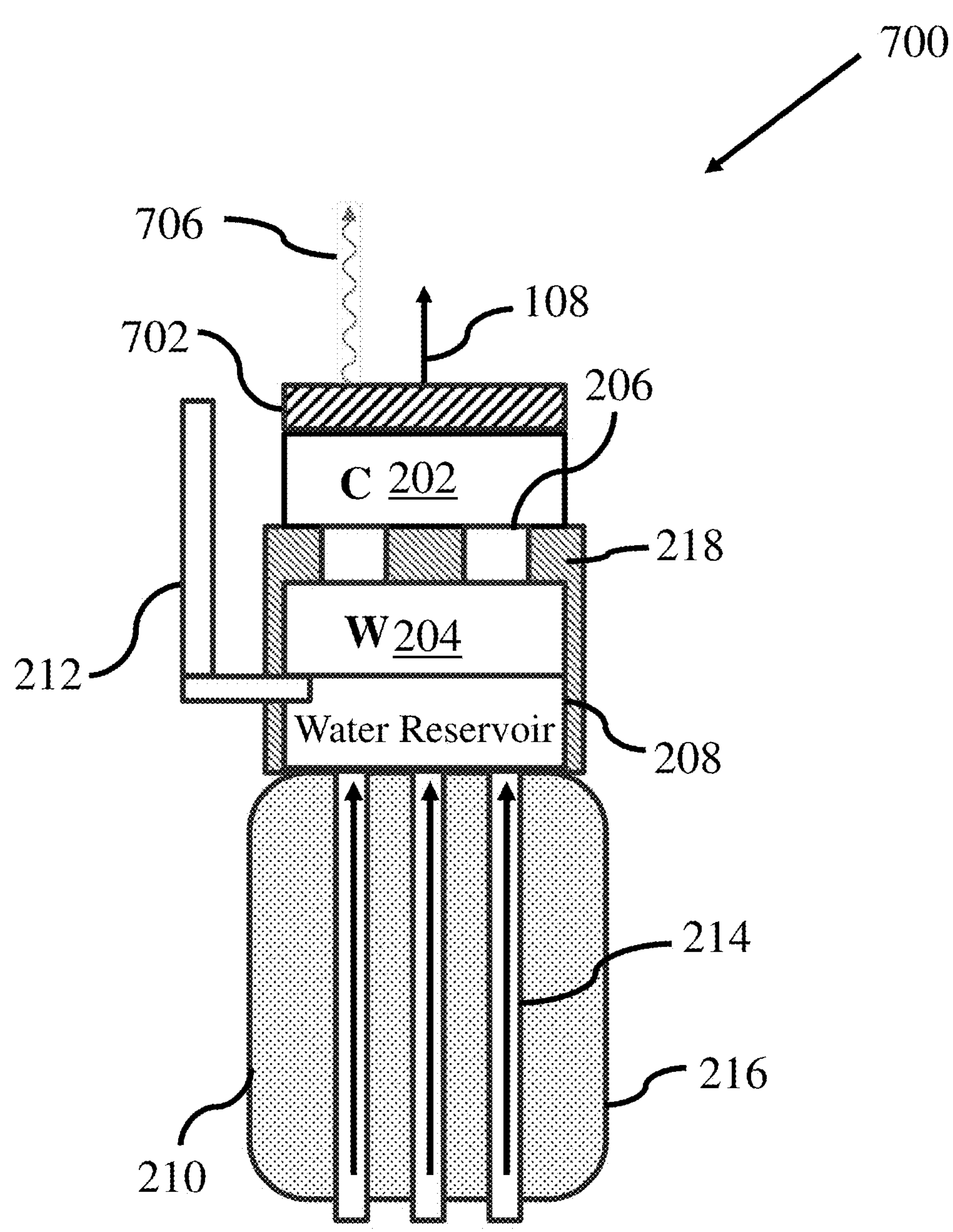
FIG. 7B illustrates the TEG of FIG. 7A operating in a night mode.

FIG. 7B illustrates TEG 700 operating in a night mode. During the nigh time, thermally conductive structure 202 is the cold side and thermally conductive structure 204 is the warm side, for example as discussed above with reference to FIG. 4B. In operation in the nighttime mode, after hybrid solar absorbing and radiative cooling layer 702 has been heated throughout the day by the sunlight, hybrid solar absorbing and radiative cooling layer 702 loses heat 706 to space without significant reabsorption by the atmosphere, leading to a cooling effect. This cooling effect is transferred to thermally conductive structure 202, thus further reducing the temperature of thermally conductive structure 202. As such, the temperature difference between thermally conductive structure 202 and thermally conductive structure 204, for example when deployed wherein thermally conductive structure 202 is the cold side and thermally conductive structure 204 is the warm side, is further increased. This increase in temperature difference between thermally conductive structure 202 and thermally conductive structure 204 translates into higher power output generated by the plurality of thermoelectric devices.

Figure 8A:
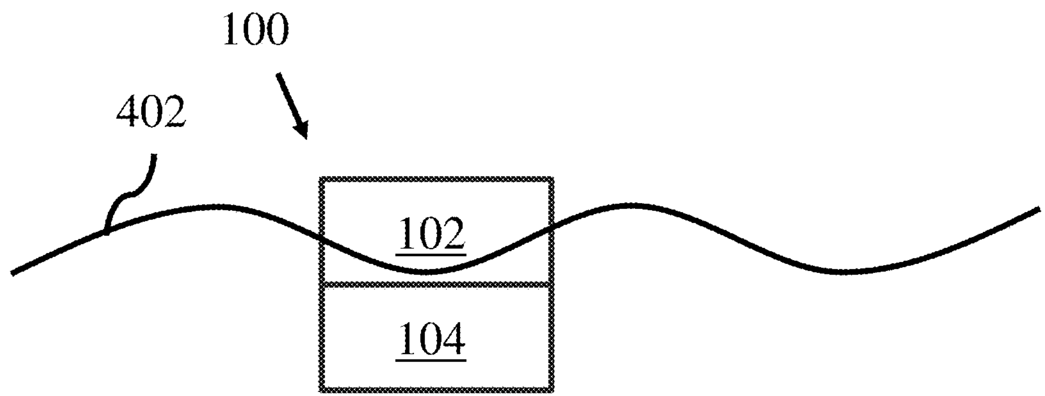
FIG. 8A illustrates the device of FIG. 1A operating at the surface of a body of water.

In the non-limiting example embodiments discussed above, device 100 is described as being deployed on the surface of the body of water 402. This is illustrated in FIG. 8A. However, in accordance with aspects of the present disclosure, device 100 may be deployed at a depth below the surface of the body of water. This will be described in greater detail with reference to FIG. 8B.

Figure 8B:
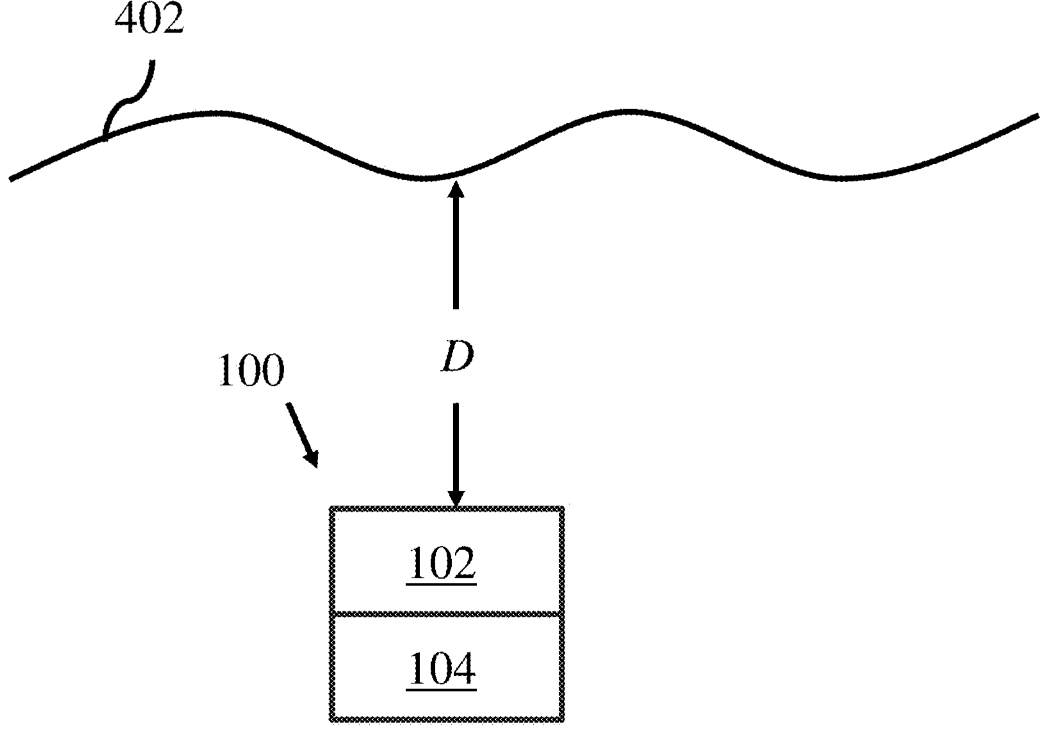
FIG. 8B illustrates the device of FIG. 1A operating below the surface of the body of water.

FIG. 8B illustrates device 100 operating at a depth, D, below the surface of the body of water. Device 100 may be deployed at any depth, so long as the difference in temperature of the water surrounding thermally conductive structure 202 and the temperature of the water at bottom portion 222 of water drawing structure 210 is sufficient to enable the plurality of thermoelectric devices to generate electricity that is sufficient for electronic system 102 to operate.

Figure 9:
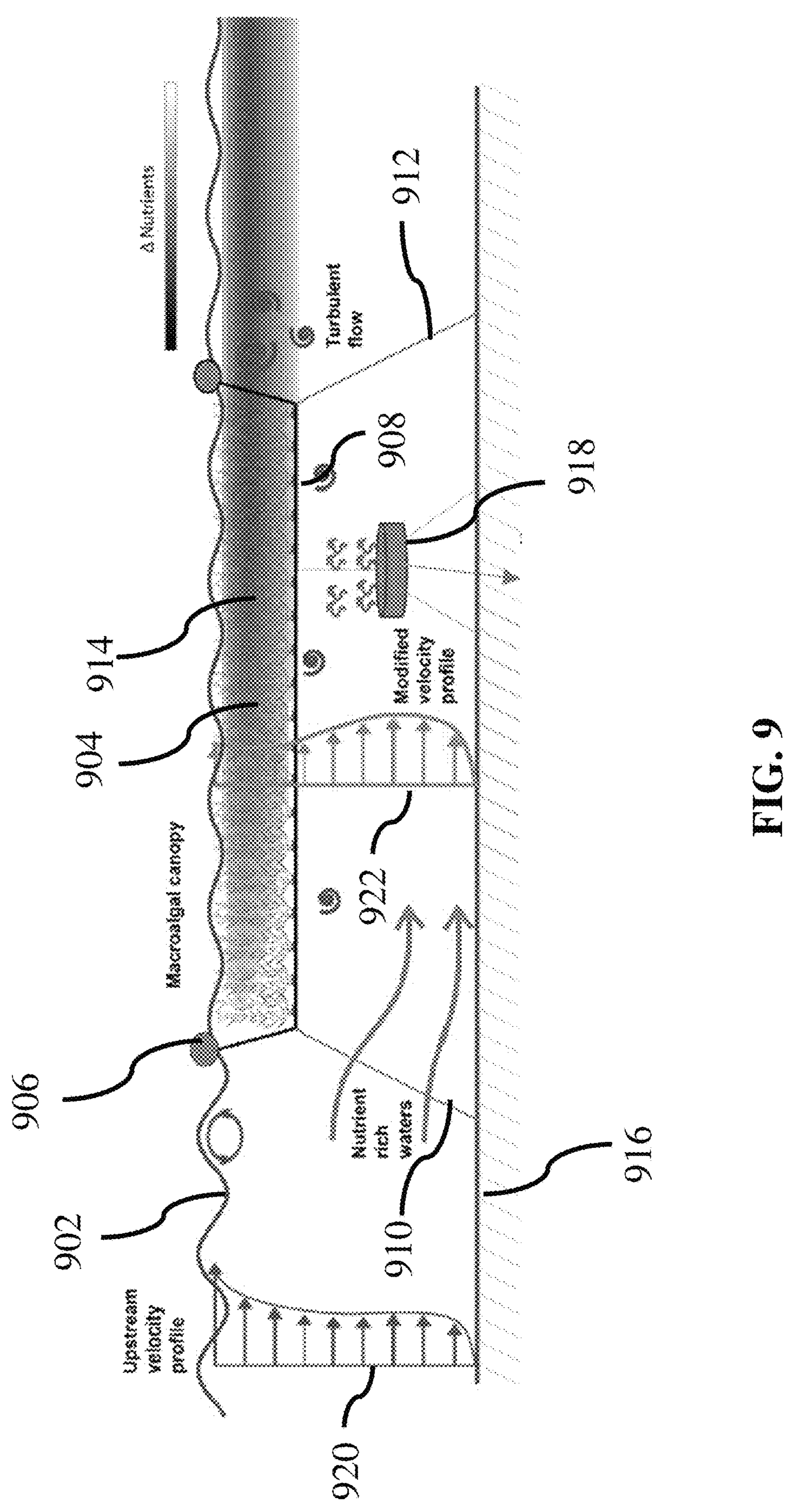
FIG. 9 illustrates a device in accordance with aspects of the present disclosure improving a microalgae farm.

FIG. 9 illustrates a device in accordance with aspects of the present disclosure improving a microalgae farm.

As shown in the figure, within a portion of a body of water 902, floats a macroalgal canopy 904, that includes a buoyant outer perimeter 906, a mesh basket 908, and tethers 910 and 912. Mesh basket 908 is configured to retain a farmed colony 914, non-limiting examples of which include seaweed and microalgae. Each of tethers 910 and 912 is connected to mesh basket 908 and is anchored to the floor 916 of the body of water and are configured to retain mesh basket 908 at a location. Buoyant outer perimeter 906 is configured to float mesh basket 908 at the surface of body of water 902 so as to maximize the amount of sunlight on farmed colony 914. A turbine 918 is disposed below mesh basket 908 and is configured to move water from below turbine 918 up to mesh basket 908. Turbine 918 may be tethered or anchored to a floor 916 of body of water 902 to maintain a position relative to mesh basket 908.

The current in the body of water has an initial velocity profile 920 approaching mesh basket 908. As shown in velocity profile 920 the velocity of the water is highest at the surface and decreases as a function of depth. However, as the water flows through mesh basket 908, and farmed colony 914 therein, the velocity of the water at the surface slows, whereas the velocity of the water below mesh basket 908 increases as indicated by velocity profile 922.

Typically, the nutrient rich water is at the bottom of the body of water. However, farmed colony 914 needs to be close to the surface of the body of water in order to receive the needed sunlight to perform photosynthesis. Accordingly, turbine 918 is able to move the colder, nutrient rich water from the bottom of the body of water up to farmed colony 914 within mesh basket 908. In this manner, farmed colony 914 is able to receive sufficient sunlight and nutrients to maximize growth.

In accordance with aspect of the present application, a temperature and nutrient sensor may be incorporated into turbine 918, wherein the temperature and nutrient sensor are powered by a TEG as discussed above with reference to FIG. 4A. Further, a photosensor may be incorporated into turbine 918 to detect color (contrast) change within farmed colony 914, wherein the photosensor is powered by a TEG as discussed above with reference to FIG. 4A.

In accordance with aspects of the present disclosure, a solid-state TEG energy harvester generates electricity based on the temperature difference between ambient and sub-sea/ocean temperature. Non-limiting example applications include a self-powered sensing system to measure water/air temperature utilizing the temperature difference between the hot and cold side. In some embodiments, an array of capillary tubes attached to the cold side water reservoir to draw water from sub-surface to the cold side (reservoir). In some embodiments, an array of capillary tunes may be attached to an under-sea structure for stability. In some embodiments, an air bleed tube may be attached to the water reservoir to maintain pressure difference between surface and subsea. In some embodiments, a perovskite solar cell may be attached on the hot side to complement power TEG harvester and allow IR rays to reach hot side for higher temperature difference and hence higher power. In some embodiments, an absorber surface may be attached to the hot side to increase overall power output. In some embodiments, a radiative cooler may be used to increase temperature difference for higher power output. In some embodiments, a system of buoys may be implemented with integrated energy harvesting to power sea farming sensors.

There are several disadvantages of conventional technologies to harvest energy from a body of water such as size and material compatibility issues. In accordance with aspect of the present disclosure, a TEG utilizes energy temperature difference. The warm side of the TEG is exposed to the ambient temperature (hot side) whose temperature can vary between 25-35° C., while water temperature of the body of water can serve as the cold side whose temperature can vary between 9-12° C. The temperature difference between the hot and cold side can be used to generate electricity to power buoy on-board sensors.

The foregoing description of various embodiments have been presented for purposes of illustration and description. It is not intended to be exhaustive or to limit the disclosure to the precise forms disclosed, and obviously many modifications and variations are possible in light of the above teaching. The example embodiments, as described above, were chosen and described in order to enable others skilled in the art to best utilize the disclosure in various embodiments and with various modifications as are suited to the particular use contemplated. It is intended that the scope of the disclosure be defined by the claims appended hereto.

What is claimed is:

1. A generator comprising:

a first thermally conductive structure;

a second thermally conductive structure;

a plurality of capillary tubes, each having a respective inner surface and a respective outer surface;

a stabilization structure configured to surround said plurality of capillary tubes and to insulate at least a portion of each said respective outer surface to reduce heat transfer between the first portion of water from the body of water inside said plurality of capillary tubes and water of the body of water surrounding said plurality of capillary tubes; and a thermoelectric device, wherein, of each of said inner surfaces and each of said outer surfaces, only said inner surfaces are configured to draw a first portion of water from a body of water via a capillary force from a depth below a surface of the body of water and to provide the first portion of water from the body of water to one of said first thermally conductive structure and said second thermally conductive structure, wherein an atmosphere above the surface of the body of water has a first temperature, $T_{D1}$, and water of the body of water at the depth below the surface of the body of water has body of water temperature, $T_{D2}$, and wherein said thermoelectric device is configured to generate electricity, based on a difference between $T_{D1}$ and $T_{D2}$, so as to operate an electronic system in the body of water.

2. The generator of claim 1, wherein said first thermally conductive structure is configured to be positioned at or above the surface of the body of water when $T_{D1}>T_{D2}$ so as to attain at least a first thermally conductive structure temperature of TDI via a first heat transfer with the atmosphere or water of the body of water surrounding said first thermally conductive structure, wherein said second thermally conductive structure is configured to be positioned at or above the surface of the body of water when $T_{D2}>T_{D1}$ so as to attain at most a second thermally conductive structure temperature of $T_{D1}$ via a second heat transfer with the atmosphere or water of the body of water surrounding said second thermally conductive structure, and wherein said thermoelectric device is configured to thermally contact said first thermally conductive structure and said second thermally conductive structure.

3. The generator of claim 1, further comprising:

a water reservoir configured to receive the first portion of water from the body of water from said plurality of capillary tubes; and a fluid conduit configured to enable air from above the body of water to enter said water reservoir and to enable a portion of the first portion of water from the body of water to evaporate out from said water reservoir and into air above the body of water.

4. The generator of claim 1, further comprising a photovoltaic cell configured to receive sunlight and generate a second amount of electricity based on the received sunlight.

5. The generator of claim 4, further comprising:

a solar absorbing material disposed on said first thermally conductive structure, wherein said photovoltaic cell is disposed on said solar absorbing material and is transparent in an infrared spectrum such that infrared light of the received sunlight transmits through said photovoltaic cell and is absorbed by said solar absorbing material so as to heat said solar absorbing material, which heats said first thermally conductive structure via heat transfer.

6. The generator of claim 1, further comprising a radiative cooling material disposed on said second thermally conductive structure and being configured to absorb heat from said second thermally conductive structure and emit a portion of the absorbed heat as infrared radiation, thus reducing a temperature of said second thermally conductive structure.

7. A device comprising:

an electronic system requiring electricity to operate in a body of water with an atmosphere having a first temperature, $T_{D1}$, above a surface of the body of water and a body of water depth temperature, $T_{D2}$, at a depth that is below the surface of the body of water; and a generator comprising a first thermally conductive structure, a second thermally conductive structure, a plurality of capillary tubes, a stabilization structure, and a thermoelectric device, wherein each of said capillary tubes has a respective inner surface and a respective outer surface, wherein, of each of said inner surfaces and each of said outer surfaces, only said inner surfaces are configured to draw a first portion of water from the body of water via a capillary force from the depth and to provide the first portion of water from the body of water to one of the first thermally conductive structure and the second thermally conductive structure, wherein said stabilization structure is configured to surround said plurality of capillary tubes and to insulate at least a portion of each said respective outer surface to reduce heat transfer between the first portion of water from the body of water inside said plurality of capillary tubes and water of the body of water surrounding said plurality of capillary tubes, and wherein said thermoelectric device is configured to generate the electricity, based on a difference between $T_{D1}$ and $T_{D2}$, so as to operate the electronic system.

8. The device of claim 7, wherein said first thermally conductive structure is configured to be positioned at or above the surface of the body of water when $T_{D1}>T_{D2}$ so as to attain at least a first thermally conductive structure temperature of $T_{D1}$ via a first heat transfer with the atmosphere or water of the body of water surrounding said first thermally conductive structure, wherein said second thermally conductive structure is configured to be positioned at or above the surface of the body of water when $T_{D2}>T_{D1}$ so as to attain at most a second thermally conductive structure temperature of $T_{D1}$ via a second heat transfer with the atmosphere or water of the body of water surrounding said second thermally conductive structure, and wherein said thermoelectric device is configured to thermally contact said first thermally conductive structure and said second thermally conductive structure.

9. The device of claim 7, wherein said generator further comprises:

a water reservoir configured to receive the first portion of water from the body of water from said plurality of capillary tubes; and a fluid conduit configured to enable air from above the body of water to enter said water reservoir and to enable a portion of the first portion of water from the body of water to evaporate out from said water reservoir and into air above the body of water.

10. The device of claim 7, wherein said generator further comprises a photovoltaic cell configured to receive sunlight and generate a second amount of electricity based on the received sunlight.

11. The device of claim 10, wherein said generator further comprises:

a solar absorbing material disposed on said first thermally conductive structure, wherein said photovoltaic cell is disposed on said solar absorbing material and is transparent in an infrared spectrum such that infrared light of the received sunlight transmits through said photovoltaic cell and is absorbed by said solar absorbing material so as to heat said solar absorbing material, which heats the first thermally conductive structure via heat transfer.

12. The device of claim 11, wherein the solar absorbing material comprises a material selected from a group of materials comprising black paint, carbon-based materials, silicon-based materials, metal-organic frameworks, polymers, metal oxides, $SiO_2$, $TiO_2$, $Al_2O_3$, and combinations thereof.

13. The device of claim 7, wherein said generator further comprises a radiative cooling material disposed on said second thermally conductive structure and being configured to absorb heat from said second thermally conductive structure and emit a portion of the absorbed heat as infrared radiation, thus reducing a temperature of the second thermally conductive structure.

14. The device of claim 13, wherein the radiative cooling material comprises a material selected from a group of materials comprising black paint, carbon-based materials, silicon-based materials, metal-organic frameworks, polymers, metal oxides, $SiO_2$, $TiO_2$, $Al_2O_3$, Au, Ag, and combinations thereof.

15. The device of claim 7, wherein said electronic system comprises at least one of an electronic device selected from a group of electronic devices comprising a processor, a temperature sensor, a camera, a photodetector, a chemical sensor, a depth finder, a transmitter, a receiver, a clock, a microphone, a speaker, a memory, a display, and combinations thereof.

16. A method comprising:

generating electricity via a generator of a device comprising an electronic system requiring electricity to operate and the generator, the electronic system being for use in a body of water with an atmosphere having a first temperature, $T_{D1}$, above a surface of the body of water, and a body of water depth temperature, $T_{D2}$, at a depth that is below the surface of the body of water; and operating the electronic system by using the generated electricity, wherein the generator comprises a first thermally conductive structure, a second thermally conductive structure, a plurality of capillary tubes, a stabilization structure, and a thermoelectric device, wherein each of the capillary tubes has a respective inner surface and a respective outer surface, wherein, of each of the inner surfaces and each of the outer surfaces, only the inner surfaces are configured to draw a first portion of water from the body of water via a capillary force from the depth and to provide the first portion of water from the body of water to one of the first thermally conductive structure and the second thermally conductive structure, wherein the stabilization structure is configured to surround the plurality of capillary tubes and to insulate at least a portion of each respective outer surface to reduce heat transfer between the first portion of water from the body of water inside the plurality of capillary tubes and water of the body of water surrounding the plurality of capillary tubes, and wherein the thermoelectric device is configured to generate the electricity, based on a difference between $T_{D1}$ and $T_{D2}$.

* * * * *